CIRCUITS USING TWO-VALLEY SEMICONDUCTOR DEVICES

Filed Nov. 26, 1968 3 Sheets-Sheet 1

INVENTORS M. R. BARBER
R. E. FISHER
BY
Roderick Anderson
ATTORNEY

United States Patent Office 3,548,339

Patented Dec. 15, 1970

3,548,339

CIRCUITS USING TWO-VALLEY SEMICONDUCTOR DEVICES

Mark R. Barber, Summit, and Reed E. Fisher, Parsippany, Troy Hills Township, Morris County, N.J., assignors to Bell Telephone Laboratories, Incorporated, Murray Hill and Berkeley Heights, N.J., a corporation of New York Filed Nov. 26, 1968, Ser. No. 779,063
Int. Cl. H03b *7/06*
U.S. Cl. 331—107 15 Claims

ABSTRACT OF THE DISCLOSURE

Various circuits are described in which transmission line reflections are used to control domain nucleation in Gunn-effect diodes. By appropriate choice of transmission line lengths and other parameters, such circuits can be used to generate with high efficiency a square wave pulse train, to combine the outputs of several diodes, and to store a pulse train that can be read out nondestructively.

BACKGROUND OF THE INVENTION

The structure and operation of two-valley semiconductor devices are described in detail in a series of papers in the January 1966 issue of IEEE Transactions on Electron Devices, vol. ED-13. As set forth in these papers, a negative resistance can be obtained from a device sometimes known as a Gunn-effect diode which includes a bulk semiconductor wafer of a substantially homogeneous constituency having two energy band minima within the conduction band being separated by only a small energy difference. By biasing the diode at a voltage above a prescribed threshold value, oscillations can be induced which result from the formation of discrete regions of high electric field intensity and corresponding space-charge accumulation, called domains, that travel from the negative to the positive contact at approximately the carrier drift velocity. As these domains are successively extinguished at the positive contact, pulses are generated in the external circuit; and as such the circuit may be used as a pulse generator.

Considerable effort has been made to apply the advantages of Gunn-effect diodes to systems which make use of high frequency pulse circuits such as pulse code modulation (PCM) communications systems and digital computers. For example, the copending application of M. Uenohara, Ser. No. 667,295, filed Sept. 12, 1967, and assigned to Bell Telephone Laboratories, Incorporated, describes how a Gunn-effect device can be used for regenerating pulses in a PCM system. The copending application of R. E. Fisher, Ser. No. 671,033, filed May 17, 1967 and assigned to Bell Telephone Laboratories, Incorporated, describes how an inductor in the external circuit may be used to suppress controllably the nucleation of domains in a Gunn-effect diode to permit the pulsed output frequency to be reduced to a more convenient value, and also to make frequency modulation possible.

SUMMARY OF THE INVENTION

We have found that by connecting a transmission line of finite length to a Gunn-effect diode, transmission line reflections can be used to control domain nucleation in the diode to achieve a variety of useful effects. In one illustrative embodiment, the transmission line has an electrical propagation time equal to the domain transit time in the wafer. It is connected at one end to the diode and at the other end to a load having an impedance substantially higher than the characteristic impedance of the transmission line. The diode is biased by a D-C voltage source at a value slightly below the threshold voltage required for domain nucleation, and an initial domain is nucleated in the diode by applying a starter pulse that temporarily raises the diode bias to a value above its oscillatory threshold. The diode thus generates a single pulse in the transmission line which is reflected by the load; when the reflected pulse reaches the diode it momentarily biases it above its threshold value to nucleate a successive domain. In this manner, pulses are successively generated by the diode even though the bias voltage is below threshold, and a square wave pulse train, which for many purposes is far more useful than pulses normally generated by a Gunn-effect diode, is transmitted to and utilized by the load.

By making the transmission line sufficiently long to accommodate a pulse train, the circuit described above can be used as a storage circuit for an entire pulse train which is capable of giving non-destructive read out. In this embodiment, a pulse train rather than a single starter pulse is used for triggering successive domains in the diode. After each pulse of the train has excited the diode to generate a corresponding pulse in the transmission line, the diode returns to quiescence; but then, reflected pulses return to the diode to repeat the sequential triggering operation, thereby regenerating the pulse train. In this manner, the pulse train may circulate indefinitely along the transmission line, but the stored information may be read out non-destructively by means of a load connected to the opposite end of the line having a sufficiently high impedance to insure adequate reflection.

As will be explained later, it is possible also to use pulses reflected from an open-circuited or high impedance end of a transmission line to control diode triggering even when the steady-state bias voltage exceeds threshold. This embodiment is capable of higher efficiency operation than is otherwise obtainable. Moreover, the outputs of several diodes can be easily combined to give higher power outputs.

These and other embodiments and features of the invention, along with their advantages, will be better understood from a consideration of the detailed description and drawings.

DRAWING DESCRIPTION

DETAILED DESCRIPTION

Figure 1:
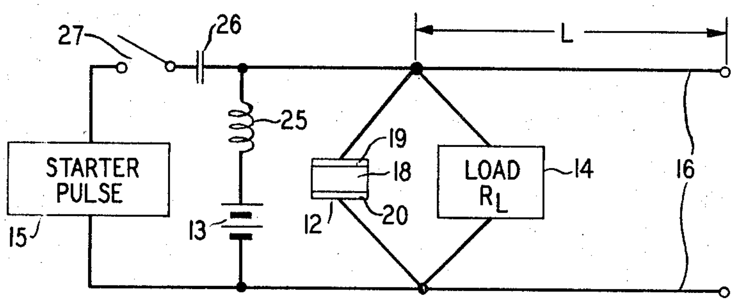
FIG. 1 is a schematic illustration of an illustrative embodiment of the invention.

Referring now to FIG. 1, there is shown a pulse generator circuit comprising a Gunn-effect diode 12, a D-C voltage source 13, a load 14 having a resistance $R_L$, a source of starter pulses 15, and a transmission line 16 connected at one end to the diode and load, and being open-circuited at the other end. The diode comprises a wafer of two-valley semiconductor material 18 contained between opposite ohmic contacts 19 and 20.

Figure 2:
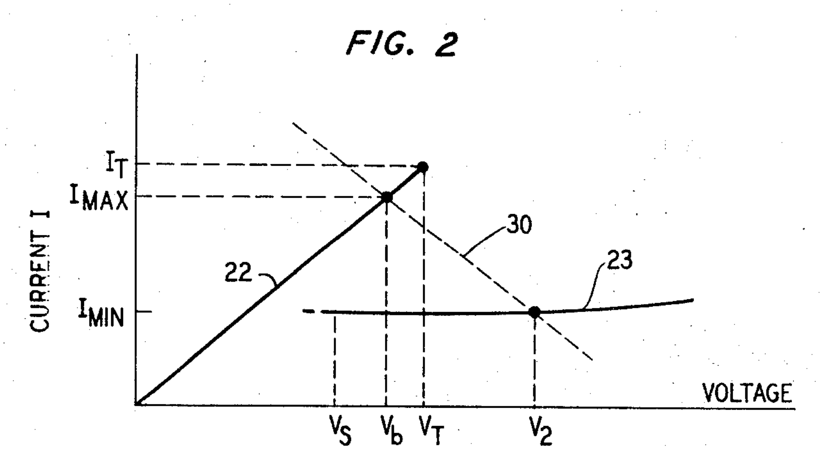
FIG. 2 is a graph of the voltage-current characteristic of a Gunn-effect diode of the type used in the FIG. 1 embodiment.

As mentioned before, a Gunn-effect diode is characterized by the capacity to form and propagate a high electric field domain in response to a bias voltage above a threshold value, a phenomenon resulting in a diode voltage-current characteristic of the type shown in FIG. 2. With the bias voltage below the oscillatory threshold value $V_T$, the diode remains in a quiescent state and presents a positive resistance $R_0$ indicated by the curve portion 22. If, however, the bias voltage exceeds $V_T$, a high field domain is formed, and the current drops to a value determined by curve portion 23. The current through the diode remains at a low value, approximately equal to $I_{min}$ during the transit of the domain from the cathode contact to the anode contact. If the bias voltage remains above $V_T$ the diode will release a current spike or "pip" when the domain is extinguished at the anode, a new domain will form, and the diode current will immediately return to the low value $I_{min}$. Hence, the classic output of a Gunn-effect diode is a series of current pips, each separated by a period equal to the domain transit time $\tau$.

If, during the transit of a high field domain, the bias voltage is reduced below $V_T$, the domain will persist in its transit if the voltage across the wafer remains above the domain sustaining voltage $V_s$, and after the domain has been extinguished, the current will revert to an appropriate value on curve portion 22. If the total diode bias voltage is suddenly reduced below the value $V_s$ the domain will be quenched or extinguished prior to its reaching the anode contact.

The purpose of the circuit of FIG. 1 is to produce across load 14 voltage pulses having a period between recurrent pulses determined by the length L of transmission line 16. In this embodiment, the voltage source 13 applies a bias voltage $V_b$ across the diode 12 which is below the threshold voltage $V_T$. In this state the diode is quiescent and conducts a high current $I_{max}$ until a starter pulse is applied to the diode from source 15. The apparatus preferably includes an R–F choke 25, a D-C blocking capacitor 26, and a switch 27 for permitting a single pulse to be applied from source 15 to the diode 12.

After the pulse is applied, a domain is nucleated causing diode current to fall to $I_{min}$ and the diode voltage to rise to a value $V_2$, determined by the parallel resistance of the load 14 and the transmission line 16, which is illustrated by the load line 30 of FIG. 2. Termination of the starter pulse does not extinguish the domain because the diode bias voltage does not fall to $V_s$; rather, for the duration of the domain transit time $\tau$, the diode current and voltage remain at $I_{min}$ and $V_2$.

Figure 3:
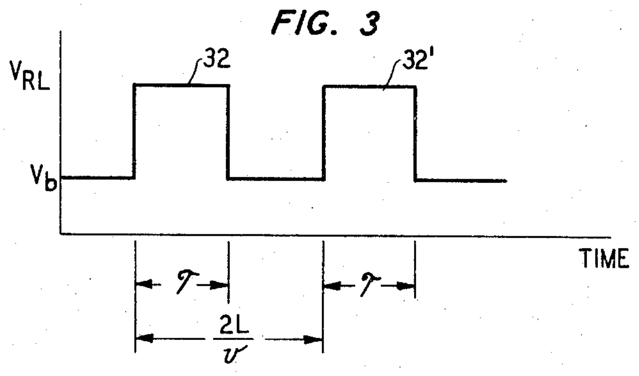
FIG. 3 is a graph illustrating a pulse train generated by the circuit of FIG. 1.

When the domain is extinguished at the anode contact 19 of FIG. 1, the diode voltage again reverts to the bias voltage $V_b$. This results in a substantially rectangular voltage pulse 32 of duration $\tau$ across the load as shown in FIG. 3. Voltage pulse 32 is also launched on transmission line 16 and, because the impedance at the open-circuited end of the transmission line is infinite, the voltage pulse is reflected back toward the diode. After a time equal to $2L/v$, where $v$ is the transmission line propagation velocity, pulse 32 is reflected back to the diode where it raises the diode voltage above $V_T$ to cause nucleation of another domain. The process of course repeats itself to generate another pulse 32' of duration $\tau$ across the load as shown in FIG. 3. It can be appreciated that each generated pulse is reflected by the open-circuited end of the transmission line to trigger still another successive pulse, and a rectangular voltage pulse train is produced across the load. As will be discussed more fully later, the voltage $V_2$ varies during a stabilizing period and eventually reaches a steady-state value determined by the load resistance $R_L$.

The period of the repetitive pulses is of course directly related to the transmission line length L and can be tailored to any desired value. If the voltage $V_2$ is in excess of $V_s$, the pulse duration is always equal to $\tau$, but if $V_2$ is lower than $V_s$, the duration of each pulse is equal to the duration of the starter pulse. For many known uses, it is particularly advantageous to design the transmission line such that the propagation time from one end to the other is equal to the domain transit time $\tau$, or in other words $$L/v=\tau \quad (1)$$

in this situation, each pulse is of duration $\tau$ and is separated by a period equal to $\tau$ in which case the rectangular voltage pulse train is square wave train; this waveform is particularly useful for PCM and digital computer applications.

It is of course contemplated that appropriate microwave components be used in constructing the circuit shown in the figure, and in any actual construction, circuit impedances other than those shown are virtually certain. In designing the circuit one should bear in mind that the reflected voltage appearing across the diode must be sufficient to bias the diode beyond its oscillatory threshold $V_T$. As is known, the terminal voltage $V_{RT}$ caused by a wave incident on the termination is given by $$V_{RT}=V_R(1+\rho) \quad (2)$$

where $V_R$ is the reflected voltage and $\rho$ is the reflection coefficient of the transmission line termination. When added to the bias voltage, the steady-state value of $V_{RT}$ should exceed $V_T$ or, $$V_{RT}+V_b>V_T \quad (3)$$

In the specific idealized circuit shown, Equation 3 is met by compliance with relation $$V_b>V_T-\Delta I R_L\cdot\frac{R_0+R_L}{R_0R_1+Z_0(R_0+R_L)} \quad (4)$$

where $\Delta I$ is the difference of $I_{max}$ and $I_{min}$, $R_0$ is the positive resistance of the diode in its quiescent state, $R_L$ is the load resistance and $Z_0$ is the characteristic impedance of the transmission line.

Figure 4:
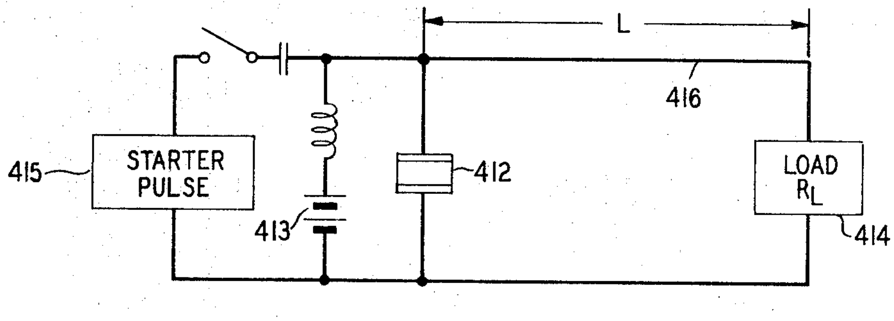
FIG. 4 is a schematic illustration of another embodiment of the invention.

The transmission line 16 is shown as being open-circuited only to illustrate one convenient technique for making voltage reflections of the proper polarity. It is necessary only that the transmission line termination opposite the diode have an impedance higher than the transmission line characteristic impedance; and this terminating impedance may be the load resistance $R_L$ as illustrated in FIG. 4. The operation of the circuit of FIG. 4 is identical to that of FIG. 1 except that the output voltages are taken across the opposite end of the transmission line, and that care is taken to make $R_L$ larger than $Z_0$. In this circuit, the condition of Equation 3 is met through compliance with the relation $$V_1>V_T-\Delta I R_0\frac{R_L-Z_0}{R_0+Z_0} \quad (5)$$

Figure 5:
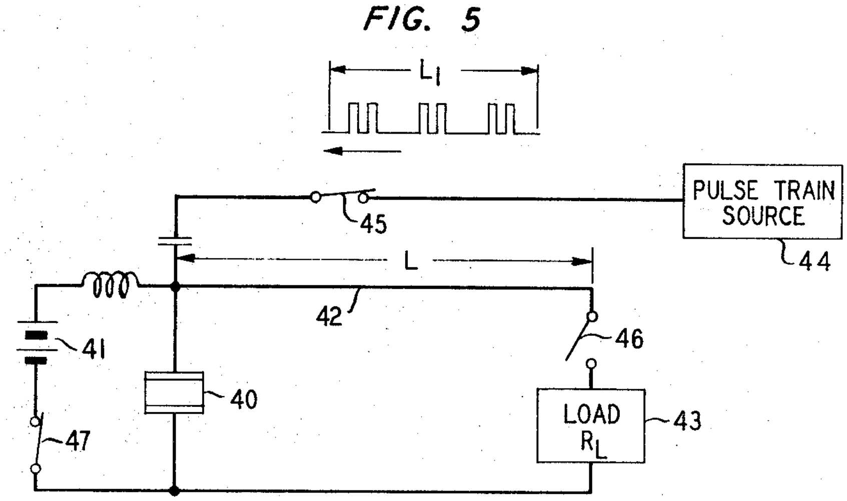
FIG. 5 is a schematic illustration of another embodiment of the invention.

The circuit of FIG. 5, which comprises a Gunn-effect diode 40, a bias source 41, a transmission line 42, a load 43, and a pulse train source 44, illustrates how the principles of the invention may be used to provide a pulse train storage circuit. When a switch 45 is closed, source 44 delivers to the diode a pulse train having an electrical length $L_1$. The length L of transmission line 42 is designed to be at least half as long as the pulse train length $L_1$. The voltage source 41 is chosen, as before, to give a bias voltage $V_b$ that is slightly below the oscillatory threshold voltage $V_T$. Each component pulse of the pulse train is of sfficient amplitude to trigger a traveling domain within the diode and therefore a voltage pulse on the transmission line. The duration of each pulse applied by the input, however, should be equal to or smaller than $\tau$.

With switch 46 at the load end of the transmission line being open, the terminated transmission line impedance is infinite and the component pulses are successively reflected back toward the diode. With the transmission line delay being longer than the pulse train duration, the first reflected pulse appears at the diode only after all of the initial pulses have excited the diode. The successive reflected pulses in turn each bias the diode above threshold as before and all of the pulses of the pulse train are regenerated. Thus, the pulse train effectively circulates along the transmission line indefinitely and is regenerated once during each round trip.

The pulse train can be detected, or read out from the transmission line, either destructively or non-destructively. If destructive read-out is desired, the resistance $R_L$ of load 43 is chosen to match the transmission line impedance $Z_0$, in which case the entire pulse train is transmitted without reflection to the load upon closure of switch 46. On the other hand, if the load resistance $R_L$ is sufficiently high to comply with the condition of Equation 3, information read-out may be made by closing switch 46, but a sufficient portion of the pulse train is reflected back toward the diode to maintain storage. In any case, the stored pulses can be erased by opening a switch 47 in the bias circuit.

Figure 6:
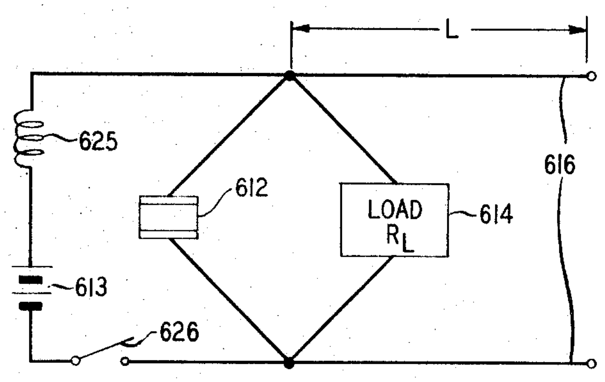
FIG. 6 is a schematic illustration of still another embodiment of the invention.

The embodiments described thus far use a steady state bias voltage that is below the threshold value $V_T$. The embodiment of FIG. 6 is identical in structure and function to that of FIG. 1 except that the bias applied by battery 613 is above $V_T$ and, as such, a starter pulse is not required for exciting oscillation generation. The chief advantage of the FIG. 6 circuit, however, is that it is capable of oscillating with a significantly higher efficiency than either the FIG. 1 circuit or conventional Gunn-effect oscillators.

When switch 626 is closed, a traveling domain is generated, which, as before, excites a voltage pulse having an amplitude determined by the current drop $\Delta I$ and the parallel combination of the load and the transmission line. The diode voltage immediately falls below threshold when the domain is extinguished, but, because of energy storage in the R–F choke 625, does not immediately thereafter rise above threshold. By definition, the time constant of choke 625 is long with respect to the operating period and the excited pulse reflected from the open-circuited end returns to the diode before the diode bias applied by the battery again exceeds threshold. Thus, domain nucleation is again controlled by reflected energy, and the period of generated pulses is $2L/v$. However, with an appropriate load resistance $R_L$, the amplitude of generated pulses grows during a stabilization period and eventually reaches a much higher value than would be true with the subthreshold biasing of FIG. 1. This, in turn, suggests a higher efficiency of operation.

Figure 7:
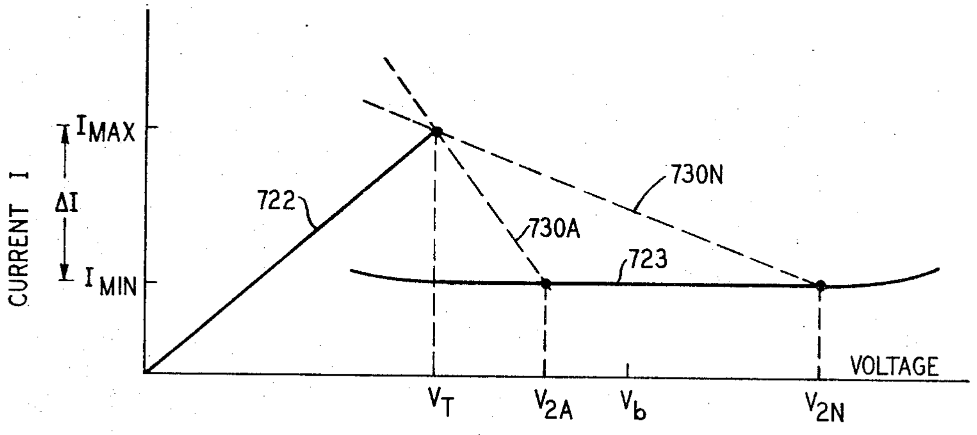
FIG. 7 is a graph of the voltage-current characteristic of the diode of the circuit of FIG. 6.

Referring to FIG. 7, when the voltage across the diode initially exceeds $V_T$, the diode "sees" an impedance equal to the parallel combination of the load resistance and the transmission line characteristic impedance, this impedance being represented by load line 730A. Thus, when the first domain is formed, the diode voltage rises immediately to $V_{2A}$. During propogation of the domain, that is, during time $\tau$, the current through the inductor 625 decays in accordance with a time constant $$e^{-\left(\frac{Z_0R_L}{Z_0+R_L}\right)\frac{t}{L}}$$

determined by the parallel impedance of the load and the transmission line. After the domain is extinguished, current from the inductor is directed almost entirely through the diode; and the inductor current increases according to a time constant $$1-e^{-R_0t}$$

determined by the diode resistance. Care is taken to insure that the inductor current directed through the diode does not reach the threshold value $I_c$ before the reflected pulse returns to bias the diode and trigger a new domain. For example, if the circuit is operated as a square wave generator, $L/v$ equals $\tau$, and $$\frac{Z_0R_L}{Z_0+R_L}>R_0 \qquad (6)$$

With this provision, the rate of inductor current decay durdomain propogation is greater than the rate of current increase during diode quiescence, and the reflected pulses, rather than current through the inductor, triggers the successive diode domains. If $L/v$ is smaller than $\tau$, this condition need not be met; but if it is larger than $\tau$, the ratio of $$R_0 \text{ to } \frac{Z_0R_L}{Z_0+R_L}$$

should be correspondingly smaller.

This discussion is somewhat simplified in that, with each successive pulse, the impedance "seen" by both the diode and the inductor 625 changes, and can be rigorously described only by transient analysis. An analysis of the stabilization period is within the skill of a worker in the art, and it can be shown that after several cycles of operation the circuit reaches an equilibrium state. During the stabilization period, the maximum and minimum voltages across the diode change with each cycle, and load line 730A moves to the right. Eventually, the voltage swings stabilize about the steady-state bias voltage $V_b$ and the diode "sees" a load impedance equal to $R_L$, represented by load line 730N.

To give maximum efficiency, the steady-state bias voltage $V_b$ should be chosen with respect to $R_L$ to give a maximum peak output voltage $V_{2N}$ consistent with the mode of operation, which requires that the diode voltage fall at least to $V_T$ during each cycle. For purposes of this discussion, it is assumed that the diode voltage must exceed $V_T$ to nucleate a domain and that $V_T$ is the maximum voltage that can be placed across the diode without nucleating a domain. In this case, a maximum peak voltage $V_{2N}$ occurs when load line 730N intercepts curve 722 at voltage $V_T$, and this, in turn, occurs when the bias voltage $V_b$ is halfway between $V_T$ and $V_{2N}$. Since $V_{2N}$ minus $V_T$ is equal to $\Delta IR_L$, the voltage $V_b$ for giving maximum efficiency is $$V_b=V_T+\frac{\Delta IR_L}{2} \qquad (7)$$

If $V_b$ is lower than that given above, it will still operate in accordance with the invention, but $V_{2N}$, $\Delta I$ and the efficiency will all be reduced.

If the circuit of FIG. 6 is used as a square wave generator (i.e., $\tau$ equals $L/v$), the efficiency $\eta$, which is equal to the power in the first Fourier component divided by the D-C power, can be expressed in terms of $r$, where $$r=I_{min}/I_{max} \qquad (8)$$

It can be shown that $$\eta=\frac{8}{\pi^2}\cdot\frac{1-r}{1+r}\cdot\left[1+\frac{2R_0}{R_L(1-r)}\right]^{-1} \qquad (9)$$

and, when the ratio of $R_L$ to $R_0$ equals infinity, $$\eta=\frac{8}{\pi^2}\cdot\frac{1-r}{1+r} \qquad (10)$$

From this, it can further be shown that a conversion efficiency of 27% is attainable using epitaxially grown gallium arsenide samples for which $r$ can be as small as one-half when the D-C bias is properly adjusted; this compares with a maximum efficiency of about 5% for the same diodes under normal operation.

As in the other oscillator embodiments, the load may be connected to the transmission line opposite the diode provided the load resistance is larger than the characteristic impedance of the line. Equations 7 through 10 apply to this version as well as that illustrated in FIG. 6. One advantage of this technique is that it can be used to combine the outputs of a number of Gunn-effect diodes as shown in FIG. 8.

Figure 8:
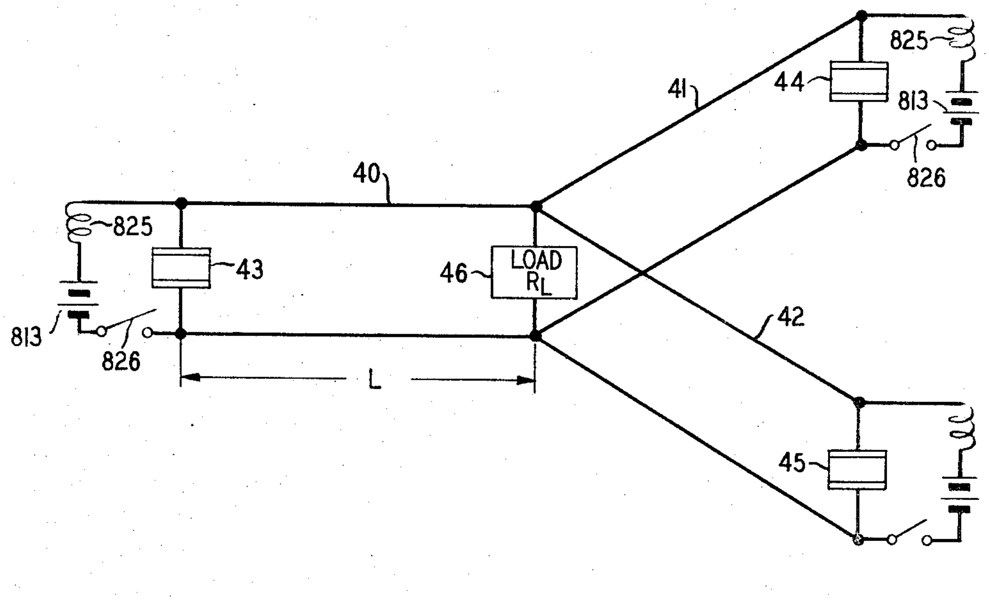
FIG. 8 is a schematic illustration of still another embodiment of the invention.

The FIG. 8 circuit comprises three transmission lines 40, 41, and 42, respectively connected at a first end to Gunn-effect diodes 43, 44, and 45, and all connected at a second end to a load 46. Each diode is operated in the same manner as the diode of FIG. 6; that is, upon closure the bias circuit switches 826, a domain is triggered in each of the diodes, thus causing a voltage pulse to be excited on the corresponding transmission line which is reflected by load 46 back to the diode for nucleation of a successive romain. The R–F chokes 825 each have a time constant much longer than the round trip transit time $2L/v$.

The various oscillators are preferably symmetrical with respect to the load; that is, all of the diodes, bias circuits, and transmission lines are preferably substantially identical. To give proper reflection, the load resistance $R_L$ need not be larger than each characteristic impedance $Z_0$, but rather, it preferably complies with the relation, $$R_L > Z_0/n$$

where $n$ is the number of transmission lines, in this case three. It can be shown that, because a pulse on any transmission line "sees" the load shunted by the other two lines, the pulse reflected back toward the diode will be delayed until the pulse from at least one other line has arrived at the load. Hence, the outputs of the diode rapidly become synchronized to deliver voltage pulses at the load equal to the sum of the voltages resulting from each individual diode.

Alternatively, each of the diodes of FIG. 8 may have a steady-state bias below the threshold value $V_T$, in which case they each operate in the same mode as the diode of FIG. 4. In this case, however, a starter pulse would have to be applied, and, for the reasons given before, the circuit would not be capable of as high an efficiency.

In any of the embodiments, but especially in the FIG. 6 embodiment, a delay line may be used as the transmission line in order to give a longer electrical length while minimizing actual physical length. While Gunn-effect diodes have been used as examples throughout, any diode capable of forming and propagating high field domains, such as the piezoelectric-semiconductor devices disclosed in the copending application of B. W. Hakki, Ser. No. 638,417, filed May 15, 1967 and assigned to Bell Telephone Laboratories, Inc., could alternatively be used. Various other modifications and embodiments may be made by those skilled in the art without departing from the spirit and scope of the invention.

What is claimed is:

1. In combination:

a semiconductor diode characterized by the capacity to form and propagate a high field domain upon the application of a bias voltage above a prescribed threshold voltage;

means for applying a bias voltage to the diode that is slightly below the threshold voltage;

a transmission line connected at a first end to the diode;

signal input means for nucleating a high field domain in the diode, whereby at least one voltage pulse is excited on the transmission line; and means for nucleating subsequent high field domains in the diode comprising means for terminating a second end of the transmission line in an impedance that is higher than the characteristic impedance of the transmission line, whereby said voltage pulse is reflected from the second end back toward the first end to bias the diode beyond threshold.

2. The combination of claim 1 wherein:

the voltage pulse reflected from the second end establishes at the first end of the transmission line a voltage $V_{RT}$ that substantially complies with the relation $$V_{RT} + V_b > V_T$$

where $V_b$ is the bias voltage and $V_T$ is the threshold voltage.

3. The combination of claim 2 wherein:

the diode is further characterized by a transist time $\tau$ taken for a domain to propagate along a predetermined length thereof; and the transit time $\tau$ is substantially equal to the time taken for an electrical pulse to travel from the first end to the second end of the transmission line, whereby a square wave pulse train is generated.

4. The combination of claim 2 further comprising:

load means for utilizing the output voltage of the diode, said means connected to the first end of the transmission line;

the second end of the transmission line being open-circuited.

5. The combination of claim 2 wherein the terminating means comprises a load for utilizing the output voltage of the diode, said load being connected to the second end of the transmission line.

6. The combination of claim 2 wherein:

the signal input means constitutes means for applying to the diode a pulse train to be stored; and the electrical length of the transmission line is at least half as long as the electrical length of said pulse train.

7. The combination of claim 6 further comprising:

load means for utilizing the pulse train;

said load means being switchably connected to the transmission line, thereby permitting controllable read-out of stored information.

8. The combination of claim 7 wherein:

the load means is switchably connected to the second end of the transmission line; and the impedance of the load means is substantially higher than the characteristic impedance of the transmission line, whereby said read-out is non-destructive.

9. The combination of claim 7 wherein:

the duration of each pulse applied by the input means is equal to or smaller than $\tau$.

10. The combination of claim 7 wherein:

the load means is switchably connected to the second end of the transmission line; and the impedance of the load means is substantially equal to the characteristic impedance of the transmission line, whereby said read-out is destructive.

11. In combination:

a Gunn-effect diode characterized by the capacity to form and propagate between opposite contacts a high field domain of transit time $\tau$ in response to an appropriate voltage;

a transmission line connected at a first end to the diode, the electrical propagation time of the line being more than one-half $\tau$;

means for applying a bias voltage $V_b$ to the diode;

means including the bias voltage for nucleating a high field domain in the diode, whereby at least one voltage pulse is excited on the transmission line; and means for nucleating subsequent high field domains in a diode comprising means for terminating a second end of the transmission line in an impedance that is higher than the characteristic impedance of the transmission line, whereby said voltage pulse is reflected from the second end back toward the first end to bias the diode beyond threshold.

12. The combination of claim 11 wherein:

the terminating means comprises a load for utilizing part of the output voltage of the diode, said load being connected to the second end of the transmission line.

13. The combination of claim 12 further comprising:

at least one other transmission line having a diode connection to a first end thereof and being connected at a second end to said load;

said transmission lines and said diodes being substantially identical;

the impedance of the load being larger than the characteristic impedance of each transmission line divided by the number of transmission lines, whereby the outputs of a plurality of diodes are applied to the load.

14. The combination of claim 11 wherein:

current through the diode oscillators varies between a low value $I_{min}$ that occurs when a domain is in transit and a high value $I_{max}$ that occurs when a domain is not in transit; and the voltage $V_b$ substantially complies with the relation $$V_b = V_T + \frac{\Delta I R_L}{2}$$

where $V_T$ is the threshold voltage required for nucleating a domain in the diode, $\Delta I$ is equal to $I_{max} - I_{min}$, and $R_L$ is the resistance of the load, whereby the combination generates oscillations with high efficiency.

15. The combination of claim 14 wherein:

the diode is connected to the bias voltage applying means by an inductor having a longer time constant than the propagation time of the transmission line; and $$\frac{Z_0 R_L}{Z_0 + R_L} > R_0$$

where $Z_0$ is the characteristic impedance of the transmission line and $R_0$ is the quiescent diode resistance.

References Cited

UNITED STATES PATENTS 3,365,583 1/1968 Gunn ---------------- 331—107

JOHN KOMINSKI, Primary Examiner

U.S. Cl. X.R.

331—132